United States Patent [19]

Kurokawa et al.

[11] Patent Number: 5,263,108
[45] Date of Patent: Nov. 16, 1993

[54] ELECTRICAL CIRCUIT APPARATUS

[75] Inventors: Hiroshi Kurokawa, Kodaira; Takeshi Kato; Atsushi Takai, both of Kokubunji, all of Japan

[73] Assignee: Hitachi, Ltd., Tokyo, Japan

[21] Appl. No.: 787,407

[22] Filed: Nov. 4, 1991

[30] Foreign Application Priority Data

Nov. 2, 1990 [JP] Japan .................. 2-295381

[51] Int. Cl.$^5$ .............................. G02B 6/42
[52] U.S. Cl. ........................... 385/89; 385/92
[58] Field of Search ............... 385/76, 77, 89, 88, 385/92, 59

[56] References Cited

U.S. PATENT DOCUMENTS

| | | | |
|---|---|---|---|
| 4,678,264 | 7/1987 | Bowen et al. | 385/88 |
| 4,720,630 | 1/1988 | Takeuchi et al. | 385/89 |
| 4,863,233 | 9/1989 | Nienaber et al. | 385/89 |
| 5,039,194 | 8/1991 | Block et al. | 385/88 |
| 5,093,879 | 3/1992 | Bregman et al. | 385/93 |
| 5,104,243 | 4/1992 | Harding | 385/84 |
| 5,138,677 | 8/1992 | O'Shaughnessy et al. | 385/43 |
| 5,142,595 | 8/1992 | Chester | 385/37 |

FOREIGN PATENT DOCUMENTS

| | | | |
|---|---|---|---|
| 58-12450 | 1/1983 | Japan . | |
| 58-12451 | 1/1983 | Japan . | |
| 62-76332 | 4/1987 | Japan . | |
| 63-226607 | 9/1988 | Japan . | |
| 2106662 | 4/1983 | United Kingdom | 385/89 |

OTHER PUBLICATIONS

Goodman et al., *Proceedings of the IEEE*, vol. 72, No. 7, Jul. 1984, "Optical Interconnections for VLSI Systems," pp. 850–866.

Nagahori et al., *Information and Communication of Engineers*, Nation-Wide Conference (Japan), Spring 1990, B-944, "150 Mb/s/ch 12-channel optical parallel transmission using an LED and a PD array", pp. 4–123.

Kaneko et al., *Information and Comm. of Engineers*, Nation-Wide Conference (Japan), Spring 1990, C-276, "Thin package LED/PD array modules for optical parallel transmission," pp. 4–331.

Itoh et al., *Information and Comm. of Engineers*, Nation-Wide Conference (Japan), C-277, Spring 1990," Planar LED array module using a perpendicularly coupled configuration for optical parallel transmission," pp. 4–332.

Primary Examiner—Frank Gonzalez
Attorney, Agent, or Firm—Antonelli, Terry, Stout & Kraus

[57] ABSTRACT

A connector is provided for connecting optic fibers to electrical circuit modules. The connector includes a plurality of fiber supporting means arrayed on a first surface of the connector base in a first direction. Supporting one end of a plurality of fiber sheets each comprised of a plurality of fibers bundled into a sheet form in such a manner that the sheet surface of each fiber sheet is substantially vertical to the first surface and the first direction. A plurality of opto-electrical circuits are connected to one sheet of the plurality of fiber sheets and each comprised of an electrooptical converter or an opto-electrical converter. A plurality of contact electrodes are also provided on a second surface, opposite to the first surface, of the connector base and connected to the plurality of optoelectrical circuits.

67 Claims, 14 Drawing Sheets

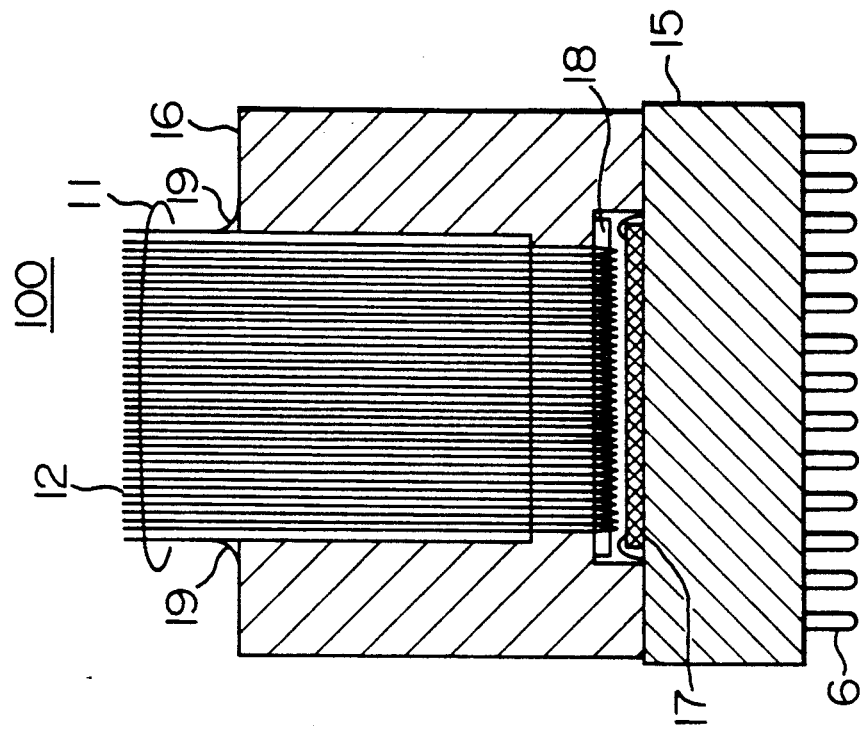
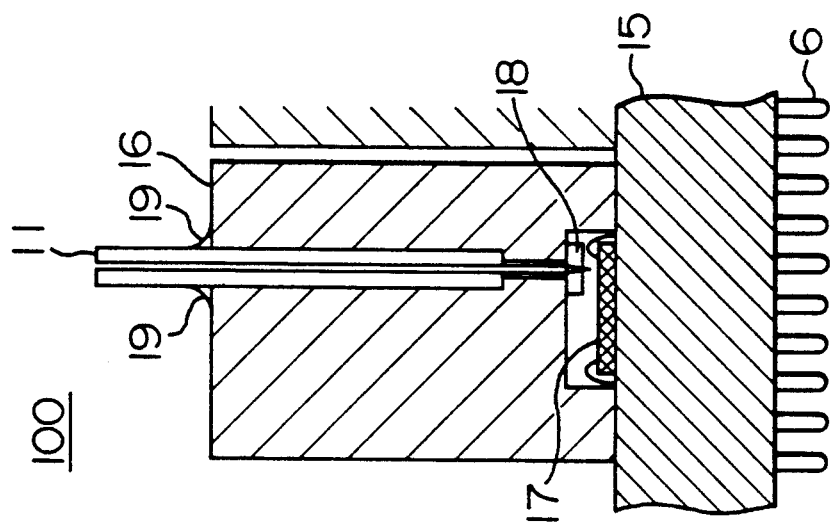

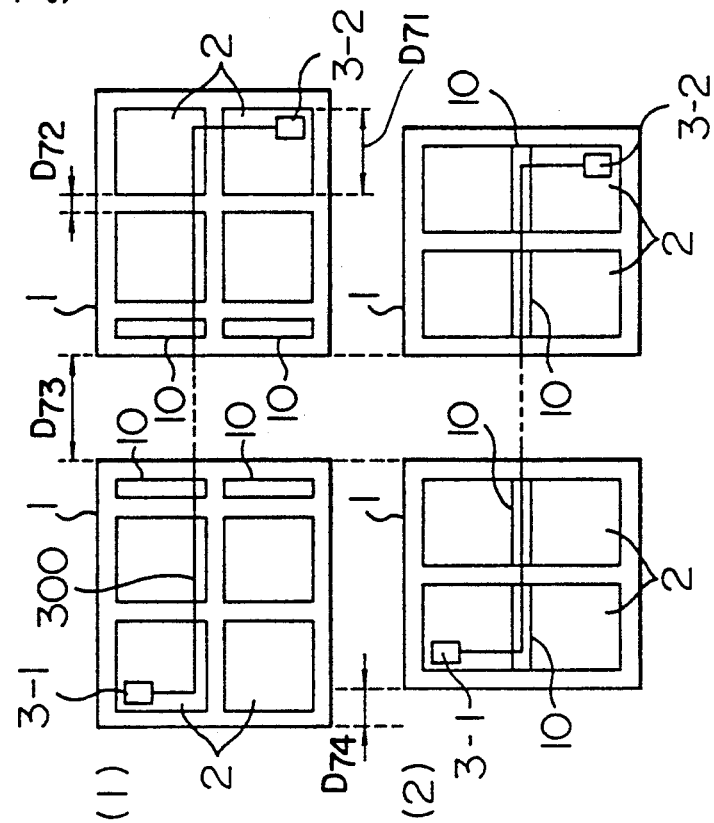

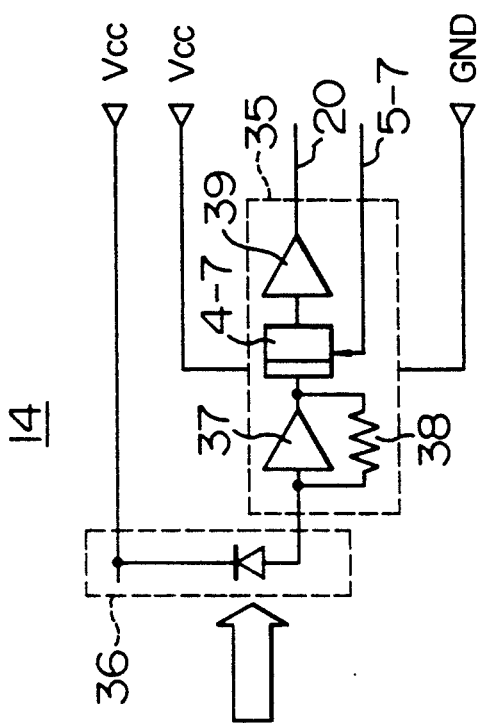
FIG. 9B
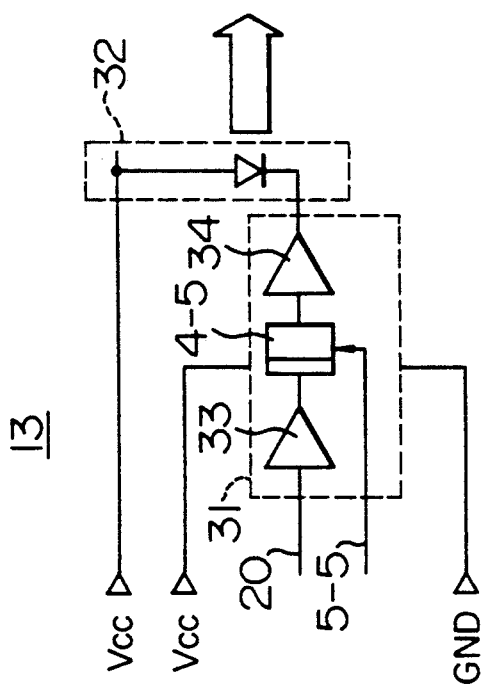
FIG. 9A
| COMPARATIVE ITEMS | PATH SECTION | SKEW (ns) | MINIMUM TRANSMISSION DISTANCE (ns) |
|---|---|---|---|
| REG INCONPARATING OPTICAL CONNECTOR | 4-1→4-5 | 0.32 | 0.34 |
| | 4-5→4-7 | 0.34 | |
| | 4-7→4-3 | 0.32 | |
| OPTICAL CONNECTOR | 4-1→4-3 | 0.98 | 0.98 |
FIG. 10

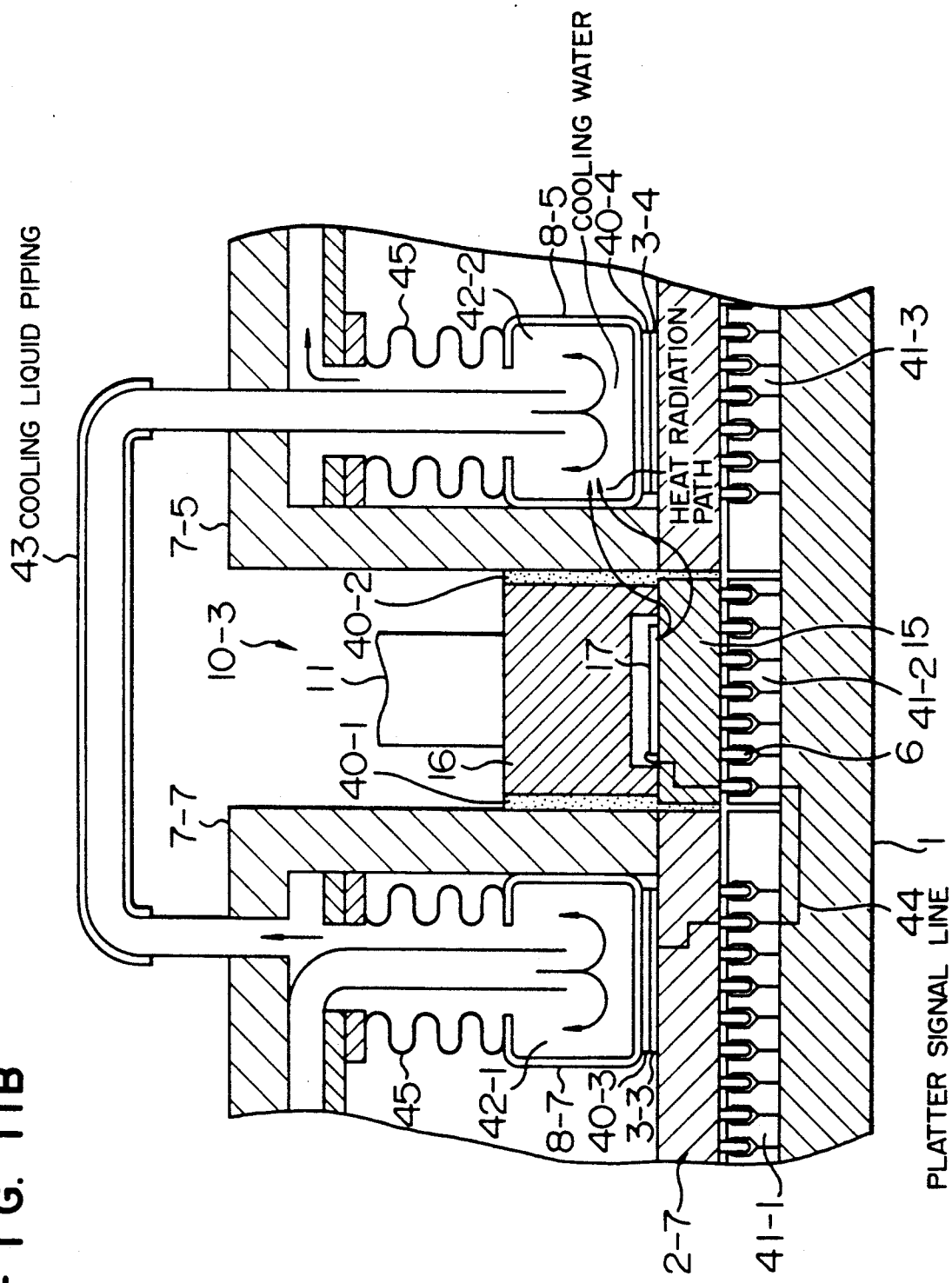

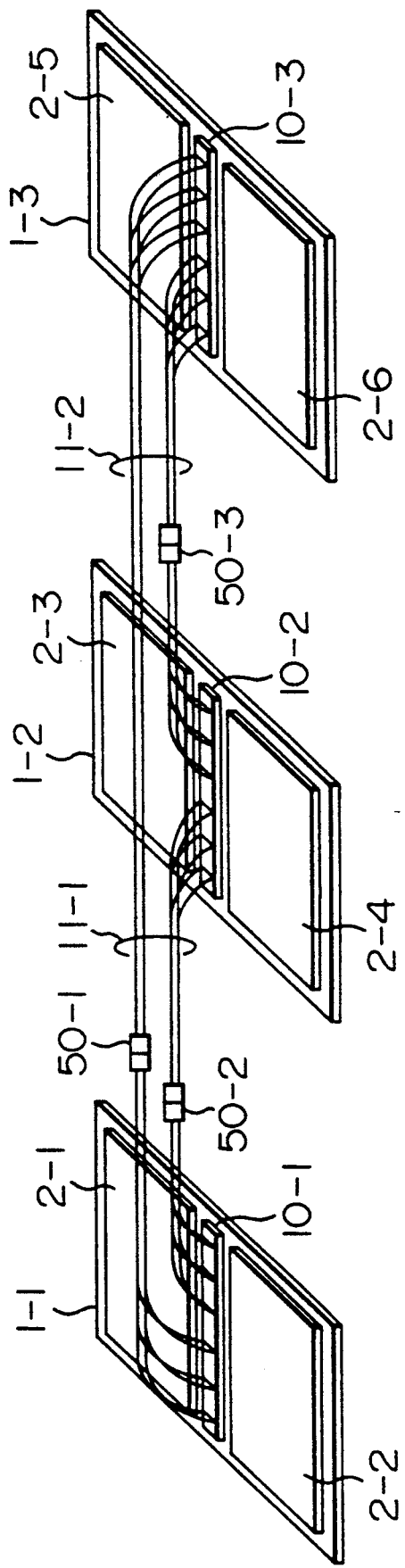

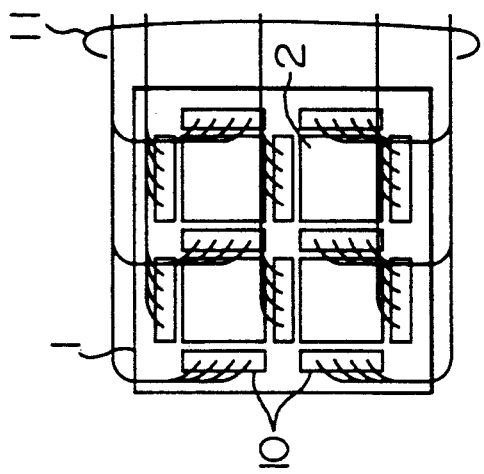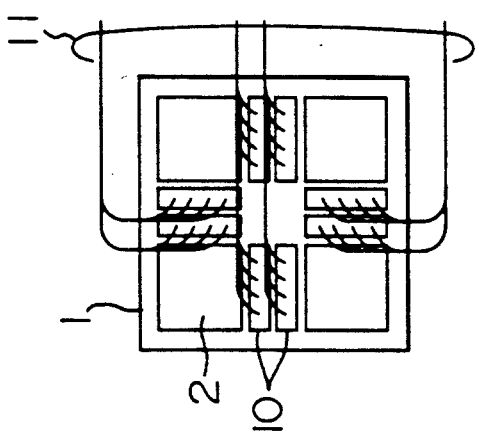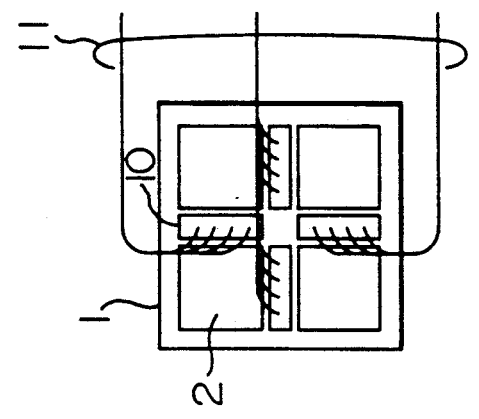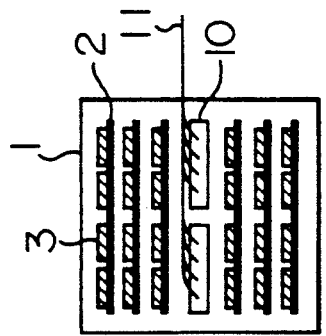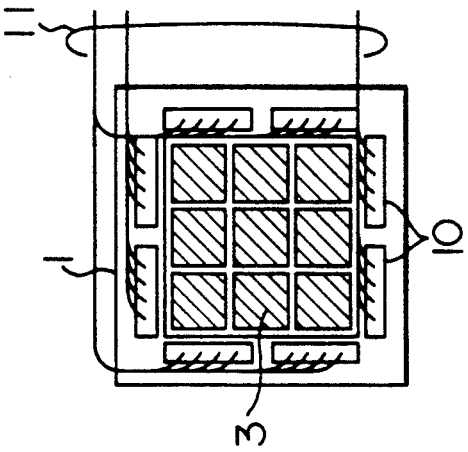

F I G. 14
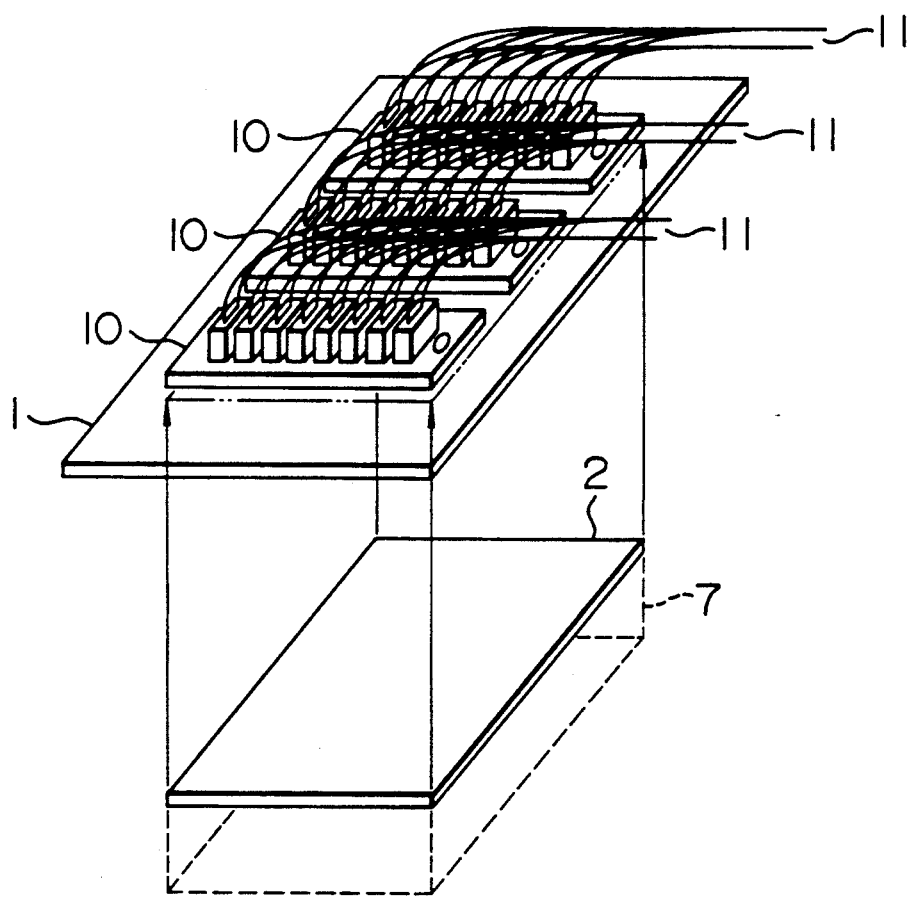

ELECTRICAL CIRCUIT APPARATUS

BACKGROUND OF THE INVENTION

The present invention relates to electrical circuit apparatus, and, more particularly, to an optical fiber connector of the type used to connect an electrical circuit board and optical fibers.

A recent advance in optical communication technology has realized an optical interconnection wherein an electrical signal is converted into an optical signal which in turn is transmitted through the use of optical fibers. Advantages of the optical interconnection using optical fibers can be enumerated as follows.

Firstly, by arraying optical fibers each having a small diameter in a sheet configuration, space reduction can be attained. The optical fibers arrayed in a sheet configuration can afford to permit a mechanism for alignment of optical axes of connectors supporting the optical fibers to be common to these connectors, thus accomplishing reduction in size of the connector.

Secondly, the optical fiber can transmit a signal of the order of Gbps (giga-bit/second). Such signals would be degraded in signal waveform by a coaxial cable, and would be difficult to transmit therethrough. Therefore, the use of optical fiber increases the throughput of signal transmission.

Thirdly, the occurrence of crosstalk noise and common ground noise which are increased in proportion to frequency components of signal and density of signal lines can be prevented.

These advantages are useful especially to switching systems and computers in which a great number of electronic circuit parts are interconnected together by a great number of high-speed signal lines to perform high-speed processing, and the possibility of applying the optical interconnect technology to these apparatus has been studied by many researchers.

For example, in experimental results of transmission using a thin LED/PD array module for optical parallel transmission which were announced in the Institute of Electronics, Information and Communication of Engineers, Nation-wide Conference, Spring, 1990, 8-944, C-276 and C-277, an example was reported where from the standpoint of size reduction of optoelectrical converters, an electrical circuit and an electrooptical signal converter as well as an electrical circuit and an opto/electrical signal converter are integrally formed into an integrated circuit to attain the size reduction.

Also, in JP-A-58-12450 entitled "Inter-package Optical Transmission System" and JP-A-58-12451 entitled "Mother Board and Inter-package Optical Connection System", an example is disclosed where an optoelectrical converter is disposed at an edge portion of a board carrying electronic circuit parts and an electrical signal is multiplexed and converted into an optical signal which in turn is transmitted between boards.

Although being considered as general conception of optical interconnection connector not related to specific apparatus, a technique is known as disclosed in "Proceedings of the IEEE, Vol. 72, July 1984", according to which a multiplexing circuit and an optoelectrical converter are formed on a GaAs chip, electrical circuits formed on a plurality of Si chips surround the GaAs chip and a plurality of signals transmitted from the plurality of Si chips are multiplexed on the GaAs chip so as to be transmitted using a single optical fiber.

In JP-A-62-76332, a connector for connecting optical fibers and an electrical circuit board incorporates an optoelectrical converter and an elect-optical converter, in order that the optical fibers can readily be mounted to or dismounted from the board.

SUMMARY OF THE INVENTION

In order to interconnect together electronic circuit parts constituting an actual switching system or a computer, it is desirable that a great number of fibers, amounting up to approximately several of hundreds or more, can be connected. And besides, a connector for the fibers is desired to be compact.

Further, in applying the optical fibers to the actual switching system or computer, capability of maintenance must be ensured. To this end, the optical connector and the electronic circuit part must be mechanically separable from each other, in other words, disposed in exchangeable fashion. If, as in the case of the aforementioned JP-A-62-76332, the optical connector and electronic circuit part ar made to be mechanically separable, then the length of electrical signal lines for connecting the optical connector and electronic circuit part is increased to increase skew (shift of signal transmission delay time). In addition, since the electrical signal lines are formed in high density on the board, crosstalk noise is also increased in proportion to the elongation of the electrical signal lines. Further, disposition of the optoelectrical converter midway on the signal transmission path raises an essential problem that the signal transmission delay time and skew are further increased. This problem is of significance in the switching system or computer requiring high-speed processing and must be solved.

On the other hand, cooling of the optoelectrical converter is also important. For example, when a current of average 10 mA is passed through a single optoelectrical converter under the application of 5 V of power supply voltage, heat is generated at a rate of .50 mW in the converter. If cooling is effected by means of a heat sink for radiation of heat generated in the optoelectrical converter, then the provision of the heat sink disadvantageously increases the size of the switching system or computer.

Accordingly, a main object of the present invention is to provide a compact optical connector suitable to connect electronic circuit parts carried on a plurality of boards and a great number of optical fibers and an electronic circuit apparatus using the optical connector.

A second object of the invention is to provide an optical connector suitable to reduce the signal transmission delay time and skew of the whole of electrical and optical signal lines used for interconnection of electronic circuit parts carried on different boards and an electronic circuit apparatus using the optical connector.

A third object of the invention is to provide an optical connector which is suitable, even without being increased in size, to radiate heat generated by an optoelectrical converter and an electrooptical converter and an electronic circuit apparatus using the connector.

To accomplish the above objects, an electrical circuit apparatus according to one embodiment of the present invention comprises:

first and second electrical circuit boards;

at least two circuit modules provided on each of the electrical circuit boards and each including a plurality of electrical circuits;

a connector of the first kind disposed on each electrical circuit board so as to be positioned between the two circuit modules provided on each electrical circuit board and having on its upper surface a plurality of contact electrodes electrically connected to the two circuit modules;

a detachable connector of the second kind positioned above the connector of the first kind disposed on each electrical circuit board and having on its lower surface a plurality of contact electrodes coupled to the plurality of contact electrodes of the connector of the first kind; and a plurality of fibers connected to a connector of the second kind provided on the first electrical circuit board and to a connector of the second kind provided on the second electrical circuit board, the connector of the second kind having a plurality of optoelectrical circuits each being connected to one of the plurality of fiber sheets and to at least one of the plurality of contact electrodes possessed by the connector and each being comprised of an electrooptical converter or an optoelectrical converter.

A connector of the second kind according to the invention comprises:

a connector base;

a plurality of fiber supporting means arrayed on a first surface of the connector base in a first direction and each supporting one end of one of a plurality of fiber sheets each comprised of a plurality of fibers bundled into a sheet form in such a manner that the sheet surface of each fiber sheet is substantially vertical to the first surface and the first direction:

a plurality of optoelectrical circuits each being connected to one sheet of the plurality of fiber sheets and each being comprised of an electrooptical converter or an optoelectrical converter; and a plurality of contact electrodes provided on a second surface, opposite to the first surface, of the connector base and connected to the plurality of optoelectrical circuits.

BRIEF DESCRIPTION OF THE DRAWINGS

FIG. 4A and 4B are sectional views respectively taken on the line 4A—4A and the line 4B—4B of FIG. 3A;

FIGS. 7A to 7C are diagrams for explaining the effects of the first embodiment;

FIGS. 9A and 9B are circuit block diagrams of light transmitting and receiving units used in the second embodiment, respectively;

FIG. 10 is a diagram for explaining the effects of the second embodiment;

FIG. 11B is a sectional view taken on the line 11B—11B of FIG. 11A;

FIG. 12 is a perspective view showing a construction in which signals are transmitted among three platter boards by using optical connectors according to the present invention;

FIGS. 13A to 13E are diagrams showing examples of arrangement of optical connectors in accordance with the invention; and FIG. 14 is a perspective view showing a further example of arrangement of optical connectors in accordance with the invention.

DESCRIPTION OF THE PREFERRED EMBODIMENTS

First Embodiment

Figure 1:
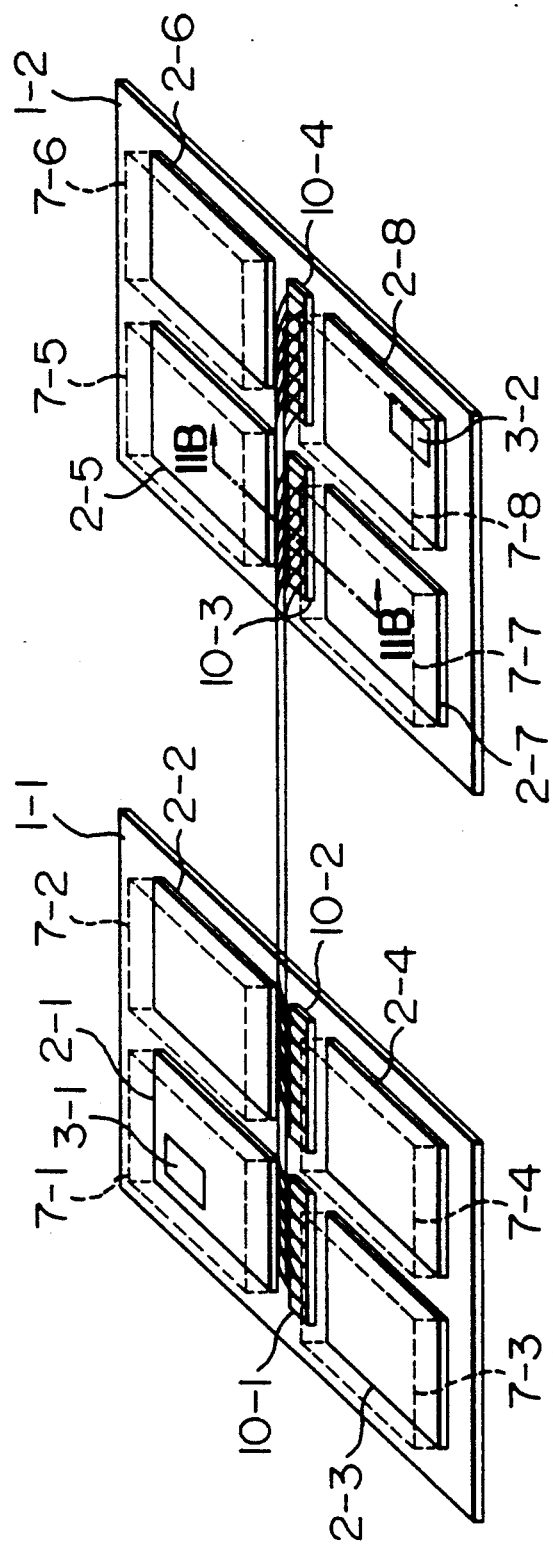
FIG. 1 is a perspective view showing a first embodiment of an optical connector according to the present invention.

FIG. 1 shows, in perspective view form, a first embodiment of a optical connector according to the invention.

Referring to FIG. 1, transmission/reception of signals is effected through an optical fiber cable 11 between a platter board 1-1 carrying a plurality of connectors 10-1 and 10-2, respectively disposed between module substrates 2-1 and 2-3 and between module substrates 2-2 and 2-4, and a platter board 1-2 carrying a plurality of optical connectors 10-3 and 10-4 respectively disposed between module substrates 2-5 and 2-7 and between module substrates 2-6 and 2-8.

The connectors 10-1 to 10-4 are pin connectors as will be described later, and socket connectors to be coupled to these pin connectors are not depicted for simplicity of illustration. Practically, however, the socket connectors are so carried on the platter board 1-1 or 1-2 as to lie between, for example, two module substrates 3-1 and 3-2.

Each of the module substrates 2-1 to 2-8 carries a plurality of electronic circuit parts such as LSI chips, of which only electronic circuit parts 3-1 and 3-2 respectively associated with the module substrates 2-1 and 2-8 are depicted for simplicity of illustration. Each of the platter boards 1-1 and 1-2 has a great number of electrical signal lines for electrically interconnecting not only the module substrates carried on each connectors carried on each platter board, although these electrical signal lines are not illustrated. Each of the connectors 10-1 to 10-4 incorporates an optical/electrical integrated circuit (OEIC) for converting electrical signals into optical signals or optical signals into electrical signals. Regions indicated by dotted lines above the module substrates 2-i (i=1 ... 8) are reserved for disposition of cooling devices and conductive cooling plate support members 7-i for supporting the cooling devices such as conductive cooling plates. Details of the connectors 10-1 to 10-4 and the conductive cooling plate supporting members 7-i will be described later.

Figure 2:
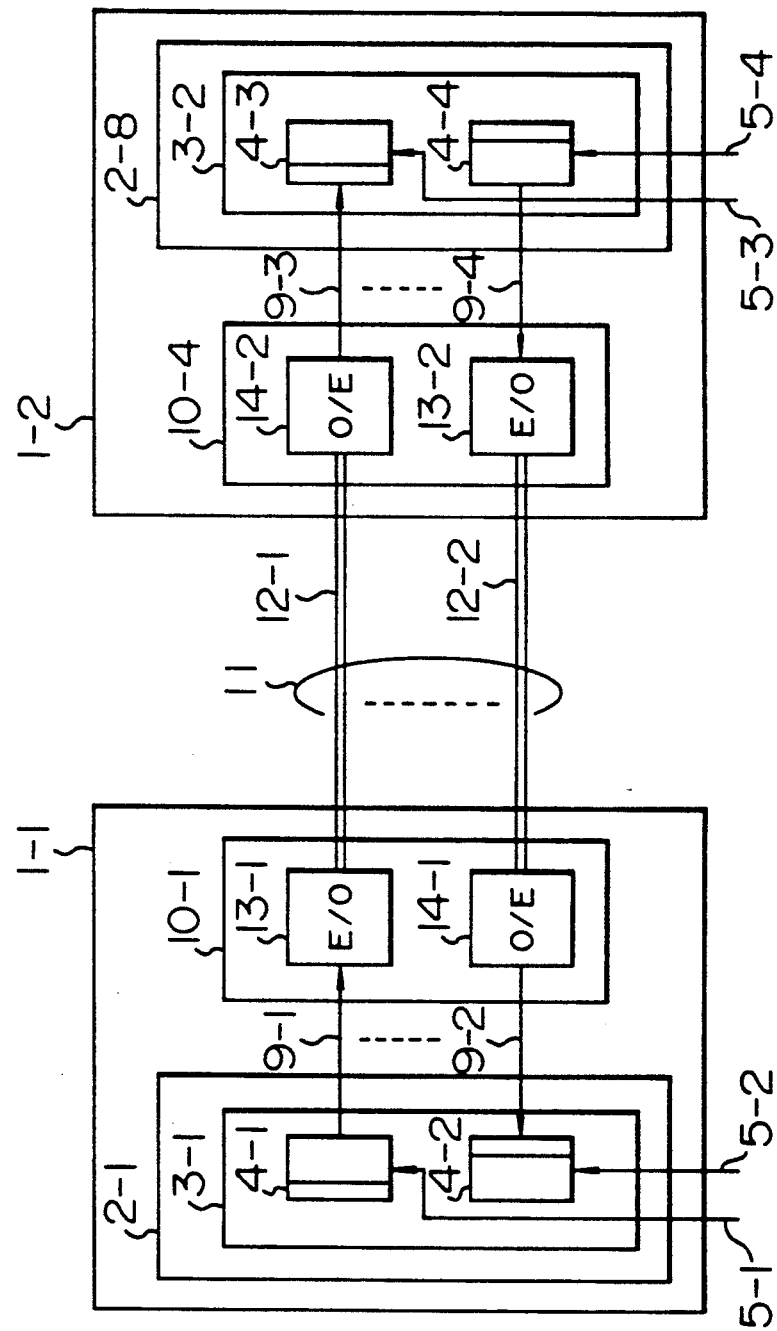
FIG. 2 is a block diagram showing a construction of the essential part of the first embodiment of the optical connector according invention.

FIG. 2 is a block diagram showing a construction of the essential part of FIG. 1. In FIG. 2, the same elements as those in FIG. 1 are designated by the same reference numerals. For simplicity of explanation, the platter board 1-1 is illustrated as carrying thereon the module substrate 2-1 and connector 10-1 alone and the platter board 1-2 is illustrated as carrying thereon the module substrate 2-8 and connector 10-4 alone. Namely, illustrated in FIG. 2 is electrical connection between the module substrates 2-1, 2-8 and the connectors 10-1, 10-4. For the convenience of illustration, the connectors 10-1 or 10-4 are disposed laterally of the module substrate 2-1 or 2-8 but practically, the connectors 10-1 or 10-4 are disposed longitudinally of the module substrate 2-1 or 2-8. For simplicity of illustration, the electronic circuit part 3-1 is depicted as incorporating a set of registers 4-1 and 4-2 for storing input data in synchronism with a clock pulse and the electronic circuit part 3-2 is depicted as incorporating a set of registers 4-3 and 4-4 for also storing input data in synchronism with the clock pulse, with the omission of other circuits. The respective registers 4-i are supplied with clock signals of the same period through clock signal lines 5-i. The connector 10-1 has a set of electrooptical (E/O) converter 13-1 and optoelectrical converter (I/E) 14-1 and the connector 10-4 has a set of O/E converter 14-2 and E/O converter 13-2.

Signal transmission from platter board 1-1 to platter board 1-2 is carried out as follows. Firstly, an electrical signal delivered out of the register 4-1 for transmission is transmitted to the connector 10-1 through the electrical signal line 9-1 formed on the electronic circuit part 3-1, module substrate 2-1 and the platter board 1-1. The electrical signal is then converted by the E/O converter 13-1 comprised in the connector 10-1 into an optical signal which in turn is transmitted to the platter board 1-2 through an optical fiber 12-1. The optical signal thus transmitted through the optical fiber 12-1 is converted by the O/E converter 14-2 comprised in the connector 10-4 into an electrical signal which in turn is applied to the register 4-3 for reception through the electrical signal line 9-3 formed on the platter board 1-2, module substrate 2-8 and the electronic circuit part 3-2. Conversely, a signal directed from the Platter board 1-2 toward the platter board 1-1 is transmitted by the register 4-4 for transmission and applied to the register 4-2 through a similar path to that mentioned above. In this manner, mutual transmission/reception of signals is effected between the platter boards 1-1 and 1-2 in synchronism with the clock.

It is to be noted that a single signal transmission/-reception path set up as shown in FIG. 2 between the transmitting module substrate 2-1 and the receiving module substrate 2-8 may be replaced with a plurality of similar signal paths. It is not always necessary that the register for transmission, for example, 4-1, and the register for reception, for example, 4-2, be formed on the same electronic circuit part (in this example, the part 3-1), and they may be formed separately on different electronic circuit parts, so that only one of the two registers may be carried on a single electronic circuit part. Further, a logical operation element may be interposed, for example, between the transmitting register 4-1 and the E/O converter 13-1 or between the receiving register 4-2 and the O/E converter 14-1. Alternatively, a plurality of signals from a plurality of transmitting registers may be time-division multiplexed by means of a selector and may be supplied to the same E/O converter. Further, the level or threshold of electrical logic signal transmitted through the electrical signal line on the transmitting side, for example, 9-1 may be different from that transmitted through the electrical signal line on the receiving side, for example, 9-3.

Figure 3A:
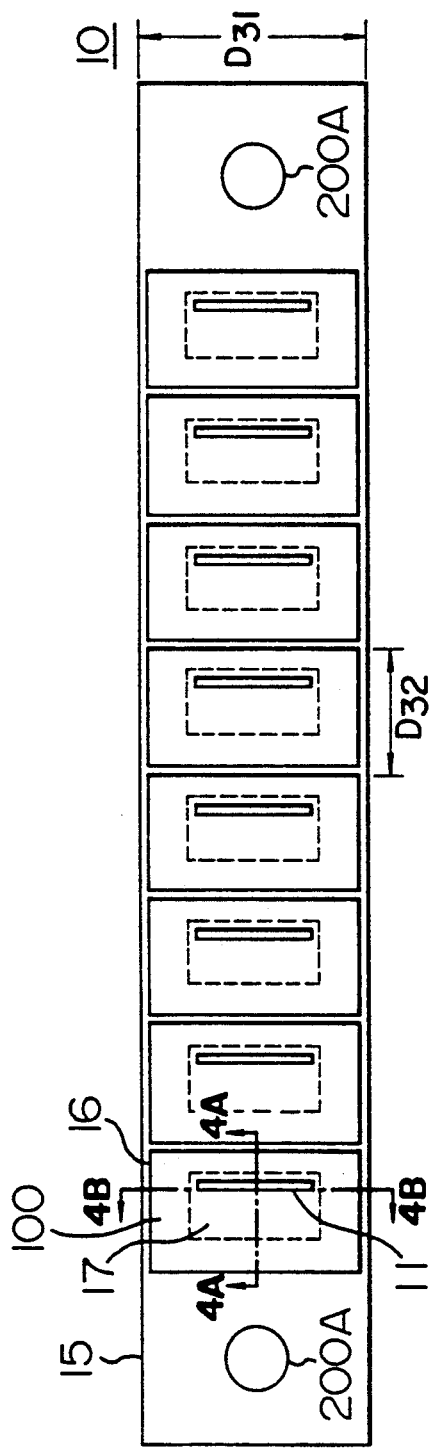
FIGS. 3A and 3B are respectively a top view and a side view of an OEIC incorporating connector shown in FIG. 1.
Figure 3B:
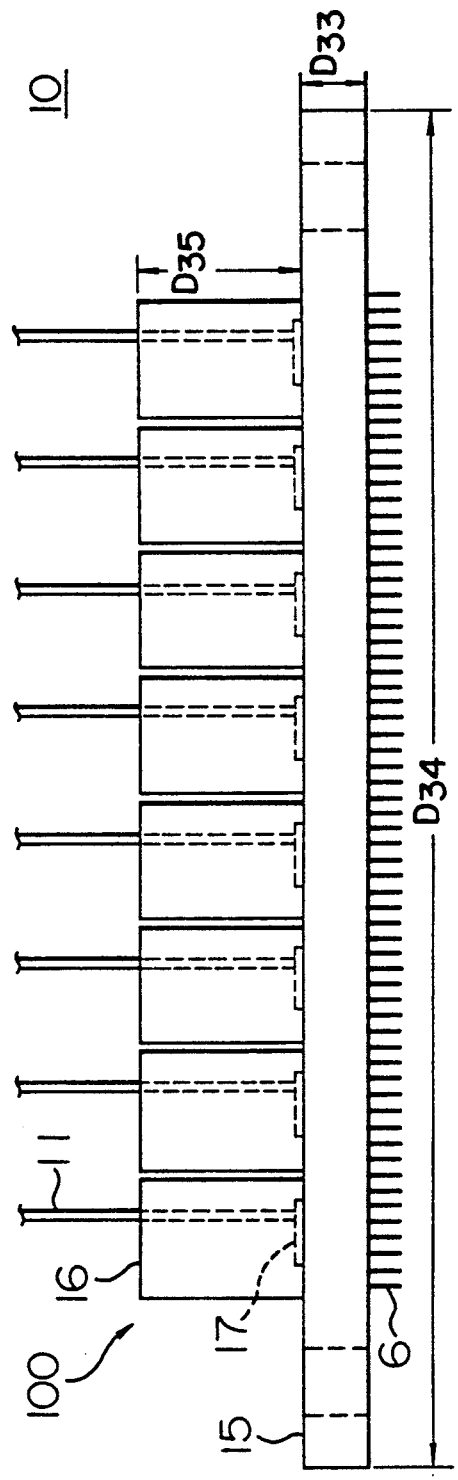

FIGS. 3A and 3B show an example of construction of the connector 10, with FIG. 3A being a top plan view and FIG. 3B being a side view. FIG. 4A is a sectional view at a portion 4A—4A in FIG. 3A and FIG. 4B is a sectional view at a portion 4B—4B in FIG. 3A.

The connector 10 is preferably disposed in a narrow space between the module substrates carried out on the platter board 1 and therefore it comprises an elongated connector base 15 and a plurality of optical connector units 100 arrayed on the surface of the connector base. Each optical unit 100 includes an OEIC chip 17, an optical fiber cable 11, a receptacle 16 for joining the optical fiber cable 11 and connector base 15, a guide 18 (FIG. 4A or 4B) for adjustment of optical axis alignment between the optical fiber 11 and light emitting elements 32 (FIG. 6A) or light receiving elements 36 (FIG. 6B) formed on the OEIC chip 17, and a fixing member 19 such as solder for fixedly securing the optical fiber cable 11 to the receptacle 16. The OEIC chip 17 is comprised in the connector in this manner and accordingly, upon mounting/dismounting of the connector, the fiber cable 11 need not be mounted or dismounted to thereby eliminate the necessity for readjustment of the optical axis of the fiber cable. Further, the optical fiber cable 11 bundles 36 optical fibers 12 into a sheet form, thus ensuring that a number of fibers 12 can be arrayed densely without imparing flexibility of the fiber cable 11. In the present embodiment, the array direction of the fibers 12 within the fiber cable 11 is orthogonal to the array direction of the receptacles 16, thus making it easy to densely array a greater number of fibers. The connector 10 shown in FIGS. 3A and 3B permits transmission or reception of optical signals corresponding to 288 optical fibers. Connected to the back of the connector base 15 are 416 connector pins 6 which are laid in staggered fashion. Of these pins, 288 pins are used for signals and 128 are used for power supply. Individual connector pins 6 are electrically connected to a given OEIC chip 17 through electrical signal lines 20 (FIG. 6) provided on the connector base 15. The connector 10 is electrically connected to the platter board 1 through connector pins 6 but mechanically, it is detachably mounted to the platter board 1. FIGS. 3A and 3B show the dimensions $D_{31}$, $D_{32}$, $D_{33}$, $D_{34}$ and $D_{35}$ which are associated with the connector base and receptacle sizes. Values typifying the dimensions $D_{31}$, $D_{32}$, $D_{33}$, $D_{34}$ and $D_{35}$ are 700 mils (17.78 mm), 400 mils (10.16 mm), 200 mils (5.1 mm), 4500 mils (114.3 mm) and 500 mils (12.7 mm), respectively. Although not shown in detail in FIG. 3B, the OEIC chip 17, connector base 15 and receptacle 16 are mutually secured and sealed by a fixing member such as solder. The lower end of the optical fiber 12 is tapered to form a small tipped spherical lens (not shown). The guide 18 is formed with a train of in-line perforations each having a diameter smaller than an outer diameter of the optical fiber, and an optical fiber 12 is inserted into a perforation so that its optical axis may be fixed. As a mechanism for positioning between the optical fiber and each of the light emitting element 32 (FIG. 6A) and light receiving element 36 (FIG. 6B), an optical coupling mechanism described in, for example, JP-A-63-226607 may be utilized. In FIG. 3A, reference characters 200A and 200B designate holes for screws used to fix the base 15 to a socket connector provided on the module substrate.

Figure 5A:
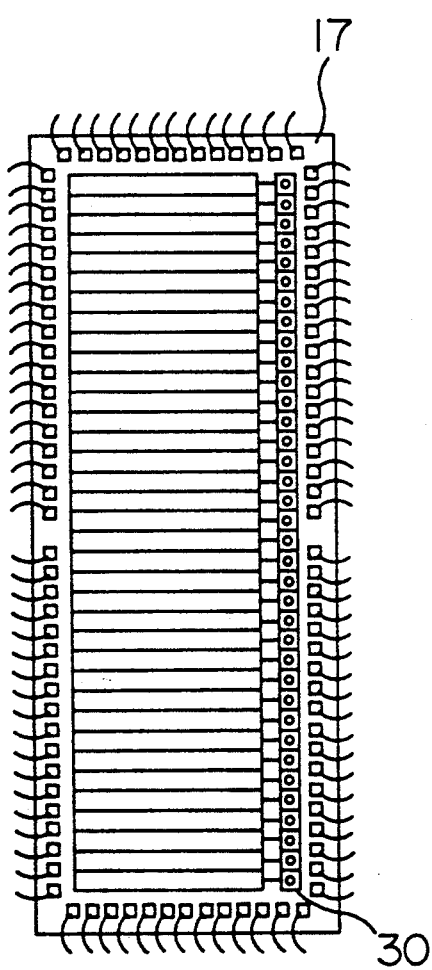
FIGS. 5A, 5B and 5C a top view of the OEIC chip shown in FIGS. 4A and 4B, an enlarged top view of a light transmitting unit of the chip, and an enlarged top view of a light receiving unit of the chip, respectively.
Figure 5B:
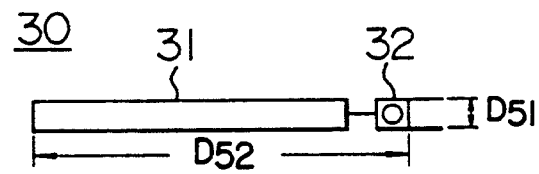
Figure 5C:
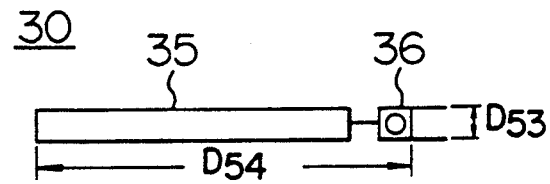
Figure 6A:
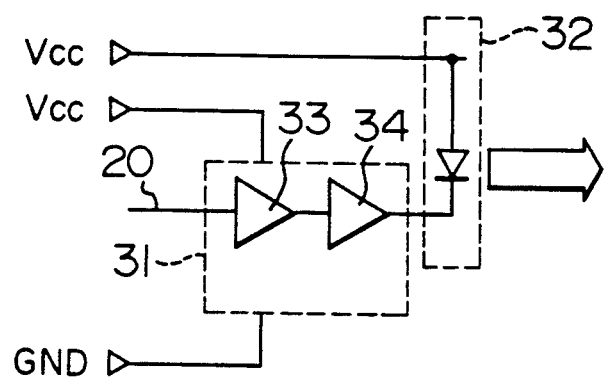
FIGS. 6A and 6B are circuit block diagrams of the light transmitting and receiving units used in the first embodiment, respectively.
Figure 6B:
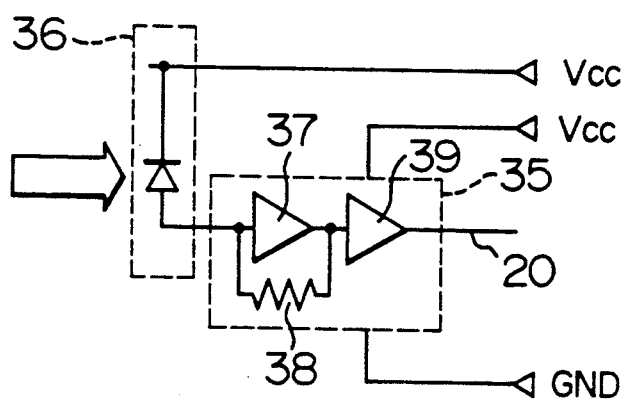

FIG. 5A is a plan view showing a construction of the OEIC chip 17. FIG. 5B shows sizes using dimensional relationship $D_{51}$ and $D_{52}$ of a light transmitting circuit block 31 and the light emitting element 32 in the OEIC chip 17, and FIG. 5C shows sizes using dimensional relationship $D_{53}$ and $D_{54}$ of a light receiving circuit block 35 and the light receiving element 36. Values typifying the dimensions $D_{51}$, $D_{52}$, $D_{53}$ and $D_{54}$ and 0.25 mm, 3 mm, 0.25 mm and 3 mm, respectively. FIG. 6A is a circuit diagram of the light transmitting circuit block 31 and FIG. 6B is a circuit diagram of the light receiving circuit block 35.

The light emitting element 32 formed on the OEIC chip 17 is optically coupled to the optical fiber 12. Similarly, the light receiving element 36 formed on the OEIC chip 17 is also optically coupled to the optical fiber 12. The light transmitting circuit block 31 includes an input gate 33 applied with an input signal from the electrical signal line 20, and a light emitting element drive gate 34 responsive to the output signal of the input gate 33 to drive the light emitting element 32, for example, a surface-emitting semiconductor laser may be used as the light emitting element. The light receiving circuit block 35 includes an input amplifier gate 37 for amplifying an electrical signal resulting from the conversion by the light receiving element 36, a load resistor 38 for converting a current modulated signal into a voltage modulated signal, and an output gate 39 for delivering the signal of the input amplifier gate 37 to the electrical signal line 20. For example, a photodiode may be used as the light receiving element 36. The light transmitting circuit block 31 and light receiving circuit block 35 can sufficiently be integrated in regions of areas approximating those shown in FIGS. 5B an 5C, respectively.

In the present embodiment, with a view of reducing the delay in signal transmission, multiplexing of signals is not effected in the connector 10. The light emitting element 32 is merely required to emit light in a direction vertical to the chip 17 and for example, light emitted horizontally from an end surface light emitting element may be reflected at a 45-degree reflector so as to be directed vertically. The light emitting element, light receiving element, light transmitting circuit and light receiving circuit are preferably formed on one chip of OEIC 17 as shown in FIG. 5A but alternatively they may be formed on different chips, respectively. For example, light transmitting and receiving circuits 31 and 35 may be formed on a Si chip, light emitting and receiving elements 32 and 36 may be formed on an InP-system semiconductor chip and these circuits and these elements may be interconnected through wire bonding connection or flip chip connection.

Figure 11A:
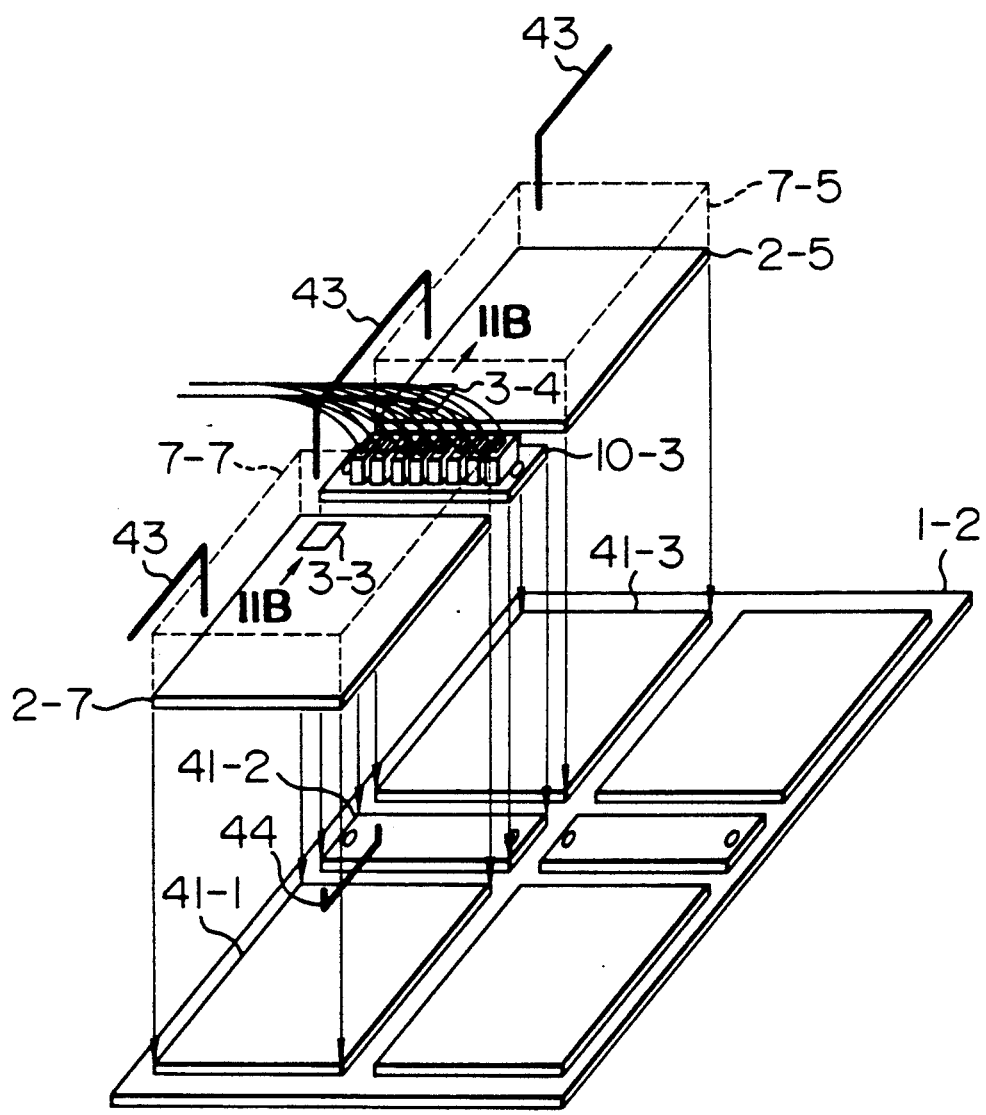
FIG. 11A is a perspective view showing the arrangement of sockets and connectors on a platter board.

FIG. 11A shows an example of packaging construction of FIG. 1. The module substrate 2-7, connector 10-3 and module substrate 2-5 are mechanically connected to the platter board 1-2 through connectors 41-1, 41-2 and 41-3, respectively. The platter board 1-2 has electrical wiring and so the connector 41-1 is electrically connected to the connector 41-2 by a platter signal line 44.

FIG. 11B is a sectional view taken on the line 11B—11B of FIG. 11A. In FIGS. 11A and 11B, the same elements as those in FIG. 1 and FIGS. 4A and 4B are designated by the same reference numerals and will not be described here. The connector base 15 and receptacle 16 constituting the connector 10-3 are interposed between the module substrates 2-5 and 2-7. The module substrates 2-5 and 2-7 are added with conductive cooling plate supporting members 7-5 and 7-7, respectively. The interior of the supporting members 7-5 and 7-7 are so constructed as to permit passage of cooling water 42-1 and cooling water 42-2. The electronic circuit parts 3-3 and 3-4 are thermally coupled, through thermally conductive members 40-3 and 40-4 such as thermally conductive grease, to thermally conductive cooling plates 8-5 and 8-7 which are thermally coupled to the cooling water 42-1 and cooling water 42-2. In this manner, the receptacle 16 is thermally coupled to the conductive cooling plate supporting members 7-5 and 7-7 by the intervening thermally conductive fillers 40-1 and 40-2 such as thermally conductive grease, the conductive cooling plate supporting members 7-5 and 7-7 are cooled through conduction, and the connector 10-3 is detachably mounted to the platter board 1. Since the conductive cooling plate supporting members 7-5 and 7-7 are thermally coupled to the cooling water 42-1 and cooling water 42-2, respectively, through the conductive cooling plates 8-5 and 8-7, the receptacle 16 and connector base 15 are cooled with water. In some applications, the conductive cooling plate supporting member may be added with a mechanism 45 for adjusting contact pressure between the electronic circuit part 3 and conductive cooling plate 8. Heat generated in the OEIC 17 is radiated through paths shown in FIG. 11B.

In the case of cooling through conduction, it is important to increase the area of heat conduction to decrease thermal resistance. To this end, the thickness of the connector base 15 is made to be large, amounting to about 5 mm as shown in FIG. 3B. In addition to ensure heat radiation through receptacle 16, the junction area between the connector base 15 and receptacle 16 is increased. Thermal resistance at the junction surface between parts made of materials other than metal or ceramic having good thermal conductivity plays an important role in performance of cooling and especially, in the present embodiment thermal resistance between the base 15 of connector 10-3 and each of the module substrates 2-5 and 2-7 is important. The sum of junction areas on both sides is about 29 cm$^2$ in the present embodiment. Even if the connector 10-3 generates heat of an amount of 15 W, heat conduction at a rate of 0.5 W per 1 cm$^2$ will surface. For example, in case where the thermal conductivity of thermal conductive grease is 1 W/m/K and the distance between the connector 10-3 and each of the module substrates 2-5 and 2-7 as well as each of the conductive cooling plate supporting members 8-5 and 8-7 is 1 mm, a temperature difference of about 5° C. can be obtained through the junction surface. In FIGS. 11A and 11B, the cooling units are additionally provided for the module substrates on both sides of the connector 10-3 but one cooling unit may be provided on only one side of the connector to achieve cooling in the same way.

FIGS. 7A, 7B and 7C are useful to quantitatively explain how the signal delay time and the skew for the transmission path can be decreased in the first embodiment. In the following, an exemplary instance will be assumed in which the electronic circuit parts 3-1 and 3-2 shown in FIG. 1 are interconnected together, that is, the transmission distance is the longest. FIG. 7A shows the transmission path which is represented by a thick line 300. It is assumed that the module substrate 2 is disposed in a square region of 10 cm side, shown as dimension $D_{71}$, the distance between adjacent square regions and between the square region and the edge of platter board 1 is 2 cm, shown as dimension $D_{72}$, the distance between the platter boards 1-1 and 1-2 is 1 m shown as dimension $D_{73}$, and the number of signal lines for interconnection of the platter boards 1-1 and 1-2 is 576. In this instance, two connectors 10 as shown in FIGS. 3A and 3B and FIGS. 4A and 4B are provided for each platter board.

In order to clarify the effects depending on the disposition of the connector 10 on the board, results of calculation of minimum delay=(signal delay time skew/2), maximum delay=(signal delay time+skew/2) and skew conducted for (1) an instance where the connector 10 is disposed on an edge portion of the platter board 1, and (2) an instance where the connector 10 is disposed between the module substrates 2 are shown in FIG. 7B. In this case, values of transmission characteristics as shown in FIG. 7C are used and common components such as registers are not illustrated. The sizes of the platter boards are also reduced, as shown by the dimension $D_{74}$ which is typified by a value of 4 cm.

Thanks to the disposition of the connector 10 between the module substrates, the wiring length of electrical signal line can be reduced by 8 cm and at the same line the optical fiber can substitute for the electrical signal line by a portion corresponding to about 44 cm of electrical signal line. This accounts for an extreme reduction in the signal delay time and skew. The effect of reduction in the signal delay time and skew, as obtained in the present example where a comparison is carried out by using the distance between the platter boards being 1 m, can be valid even for an extended inter-platter board distance of 10 m.

As described in connection with the present embodiment, by disposing the connector, for example, 10-1 between a plurality of module substrates, for example, 2-1 and 2-3, the length of electrical signal line for the connection between the electronic circuit part, for example, 3-1 and the connector 10-1 can be reduced as compared to the case where the connector is disposed at one edge portion of the platter board 1-1, thereby increasing the percentage of length which the optical fiber cable 11 occupies in the whole transmission path. Since the optical fiber cable 11 is higher in transmission speed and lower in skew than the electrical signal line (not shown) for interconnection of the optical connector 10-1 and electronic circuit part 3-1, the transmission time and skew can be reduced.

In the connector 10 described in connection with the present embodiment, the optical fiber cable 11 representative of a bundle of the optical fibers in a strap form is so mounted to the connector 10 as to be substantially vertical to the platter board 1 to which the optical fibers are mounted. The optical fiber has a small diameter and is easy to bend. Therefore, even when optical fibers totalling 1000 are put together in the FIG. 1 embodiment, a resulting bundle of the optical fibers has a sectional area of about 2 cm×2 cm and hence the bundled optical fibers can readily be disposed without preventing packaging of cooling units added to the electronic circuit part 3, for example, packaging of cooling liquid piping 43 to be described FIG. 11A.

Second Embodiment

A second embodiment of the optical connector according to the invention will now be described.

Figure 8:
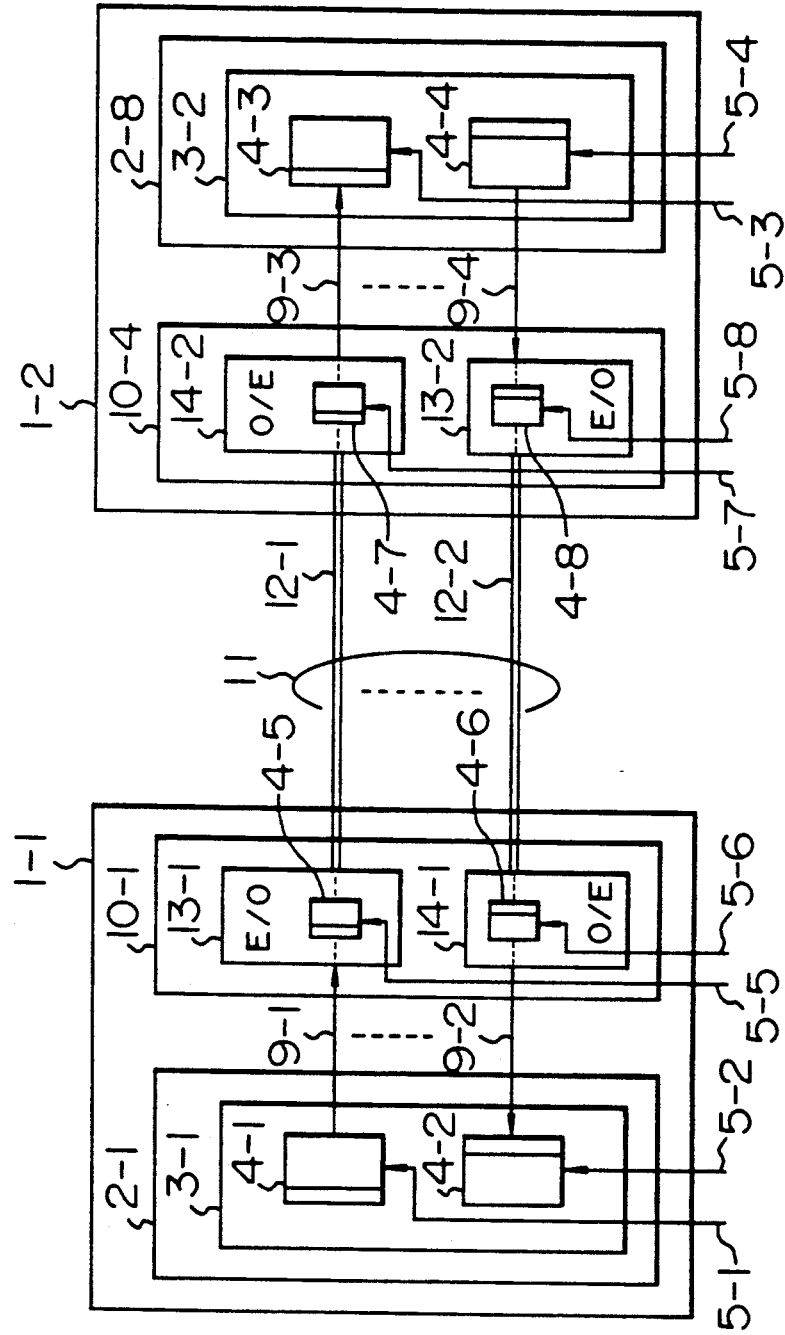
FIG. 8 is a block diagram showing a construction of the essential part of a second embodiment of the optical connector according to the invention.

FIG. 8 is a block diagram showing a construction of the essential part of the second embodiment. Like the first embodiment, the second embodiment employs module substrates 2-1 and 2-8 respectively formed on platter boards 1-1 and 1-2 but is differs from the first embodiment in that an OEIC incorporating optical connector 10 has internal registers for transmission and reception. Therefore, the construction as described with reference to FIG. 1, FIGS. 3A and 3B, FIGS. 4A and 4B and FIGS. 5A to 5C in connection with the first embodiment is valid for the second embodiment. For simplicity of explanation, the same elements as those of the first embodiment are designated by the same reference numerals.

As in the case of the first embodiment, electronic circuit parts 3-1 and 3-2 in the second embodiment have registers 4-1, 4-2 and registers 4-3 and 4-4, respectively, each of the registers being operable to store input data in synchronism with a clock. Individual registers 4-1 ($i=1\ldots 4$) are supplied with clock signals of the same period through clock signal lines 5-i. A connector 10-1 has an E/O converter 13-1 and an O/E converter 14-1 and a connector 10-4 has an O/E converter 14-2 and an E/O converter 13-2. The converters 13-1, 14-1, 14-2 and 13-2 respectively have internal registers 4-5, 4-6, 4-7 and 4-8 which are respectively applied with a clock signal having the same period as the clock signal on the clock signal lines 5-i ($i=1\ldots 4$) through clock signal lines 5-j ($j=5\ldots 8$).

In accordance with the second embodiment, an OEIC chip 17 has a transmitting circuit block 31 as shown in FIG. 9A and a receiving circuit block 35 as shown in FIG. 9B.

The light transmitting block 31 includes an input gate 33 applied with an input signal from an electrical signal line 20, a register 4-5 for transmission responsive to the clock from the clock signal line 5-5 to store an output signal from the input gate 33 and a light emitting element drive gate 34 responsive to an output signal from the register 4-5 to drive a light emitting element 32. For example, a surface-emitting semiconductor laser may be used as the light emitting element 32. The light receiving circuit block 35 includes an input amplifier gate 37 for amplifying an electrical signal converted by a light receiving element 36, a load resistor 38 for converting a current modulated signal into a voltage modulated signal, a register 4-7 for reception responsive to the clock from the clock signal line 5-7 to store an output signal from the input amplifier gate 37 and an output gate 39 for delivering a signal from the register 4-7 to an electrical signal line 20. For example, a photodiode may be used as the light receiving element 36. Although the light transmitting circuit block 31 and light receiving circuit block 35 are respectively incorporated with the registers 4-5 and 4-7, they can sufficiently be integrated in a region which is as large as the area shown in FIGS. 5A and 5B. In FIG. 8, the registers 4-i are connected with the separate clock signal lines 5-1 to 5-8 but they may be connected to a common clock signal line. Of 128 signal pins 6 used for power supply in the connector 10 shown in FIG. 4, 8 signal pins, for example, may be assigned to clock and the clock may be supplied to the individual OEIC chips 17 through the 8 signal pins.

FIG. 10 is useful to quantitatively explain a decrease in skew for the transmission path achievable in accordance with the second embodiment. As in the first embodiment, an exemplary instance will be assumed in which the electronic circuit parts 3-1 and 3-2 shown in FIGS. 1 and 8 are interconnected together, that is, the transmission distance is the longest. On the assumption that the connectors 10-1 and 10-4 are disposed between the module substrates 2 as shown at section (2) in FIG.

7A, the skew for the transmission path between the transmitting register 4-1 included in the electronic circuit part 3-1 and the receiving register 4-3 included in the electronic circuit part 3-2 is determined for an instance where the connectors 10-1 and 10-4 incorporate the registers 4-5 and 4-7, respectively, and an instance where the connectors do not. In this case, values of transmission characteristics as shown in FIG. 7C are used and common components such as registers are not illustrated.

By virtue of the incorporation of the registers 4-5 and 4-7 in the connectors 10-1 and 10-4, the skew for a transmission path between the registers 4-1 and 4-5 shown in FIG. 8 measures 0.32 ns, the skew for a transmission path between the registers 4-5 and 4-7 measures 0.34 ns and the skew for a transmission path between the registers 4-7 and 4-3 measures 0.32 ns, demonstrating that the skew is distributed substantially uniformly. Consequently, the minimum transmission distance corresponds to the maximum value of wkew which is 0.34 ns. On the other hand, the skew amounts up to 0.98 in the absence of the registers 4-5 and 4-7 incorporated in the connectors 10-1 and 10-2 and this accounts for the fact that the skew can be reduced to a great extent in accordance with the present embodiment. Even if the distance between the platter boards 1 assumed to be 1 m is extended to 10 m, a substantially similar improvement is achievable because the optical fiber has a small skew.

Applications

Preferable applications of the connector 10 will now be described. FIG. 12 shows an arrangement in which three platter boards are interconnected together by optical cables. In FIG. 12, in contrast to the foregoing embodiments, each of the three platter boards 1-1, 1-2 and 1-3 is not provided with two connectors 10 for interconnection of these boards but is provided with a single connector 10-1, 10-2 or 10-3 from which optical fibers extend to set up interconnection of the plurality of platter boards. To realize this type of interconnection, optical fibers to be connected to one connector 10-1, 10-2 or 10-3 are sorted into a plurality of sets and each set 11-1 of 11-2 is connected with an optical fiber cable connector 50-1, 50-2 or 50-3.

In this manner, by using signal connector provided on each of the plurality of platter boards 1-1, 1-2 and 1-3, interconnection of signal lines among three or more boards can be accomplished.

The thus inserted optical fiber cable connector 50 also fills the role of improving capability of maintenance. For example, in the event of a fault of the connector 10, the connector 10-1 can be removed for exchange from the platter board 1-1 by unlocking each of the optical fiber cable connectors 50-1 and 50-2. Without the optical fiber cable connectors 50-1 and 50-2, all of the three connectors 10-1 to 10-3 must be exchanged with new ones, impairing economization. Further, in the event that a trouble occurs, a measuring instrument can be connected to any of the optical fiber cable connectors 50-1 and 50-2 to determine if the trouble occurs on the transmitting side or on the receiving side.

The optical fiber cable connector 50-1 or 50-2 inserted in the optical fiber cable 11 is not limited to one in number but a plurality of optical fiber cable connectors may be inserted in series. Even in the case where 2 platter boards are interconnected together as shown in FIG. 1, optical fiber cable connectors may be inserted in the optical fiber cables.

Finally, another application of the connector according to the invention will be described with reference to FIGS. 13A to 13E. FIG. 13A shows an example in which four of the aforementioned connectors 10 are interposed between adjacent module substrates in a crucial configuration. In an arrangement shown in FIG. 13B applicable to connection of signal lines which are greater in number than those in FIG. 13A, connectors 10 are disposed side by side between adjacent module substrates 2. In an arrangement shown in FIG. 13C also applicable to connection of signal lines which are greater in number than those in FIG. 13A, there are provided, in addition to connectors 10 disposed between adjacent modules, connectors 10 which are disposed on the peripheral portion of a platter board 1. The connectors 10 disposed on the peripheral portion are connected to a nearby module substrate 2. For simplicity of illustration, the module substrates shown in FIG. 13A to 13C are removed of electronic circuit parts to be carried thereon. In an example shown in FIG. 13D, a single large module substrate 2 is mounted on a platter board 1, having connectors 10 disposed on the peripheral portion of the platter board 1. Through these connectors, the large module substrate 2 is connected to electronic circuit parts 3 carried on a nearby module substrate. In an arrangement shown in FIG. 12E, module substrates 2 each carrying electronic circuit parts 3 are mounted vertically to a platter board 1 (vertically to the sheet of drawing).

According to the present invention, the connector is mechanically detachably disposed near the module substrate carrying the electronic circuit part to reduce percentage of occupation by electrical signal lines throughout the whole transmission path and increase percentage of occupation by optical fibers, thereby ensuring that the transmission delay time and the skew can be reduced. In addition, the cooling unit for the OEIC incorporating connector can be simplified by disposing the connector near the cooling unit mounted to the module substrate to thermally couple the connector to the cooling unit. Accordingly, in any of the examples shown in FIGS. 13A to 13D, the transmission delay time and skew can obviously be reduced and the cooling unit can obviously be simplified as compared to the case where the same number of OEIC connectors are disposed at one edge of the platter board 1. It is not always necessary to mount the module substrates 2 on one surface of the platter board 1 but they may be mounted on both surfaces thereof. Alternatively, as shown in FIG. 14, module substrates 1 may be mounted on one surface of a platter board 1 and OEIC incorporating optical connectors may be disposed on the other surface.

As compared to the case where the optical connector is disposed at one edge of the board, the signal transmission delay time and skew can be reduced while ensuring capability of maintenance by disposing the optical connector between electronic circuit parts or adjacently to the electronic circuit part in accordance with teachings of the invention, and therefore the present invention is effectively applicable to high-speed signal processing apparatus such as switching system and computer in which a great number of electronic circuit parts are mutually connected by a great number of high-speed signal lines.

Further, by providing in the optical connector the register responsive to the clock of the same period as that of the clock signal applied to the module substrate to store a signal, the skew can be reduced as compared to the case where no register is provided, to reduce the signal transmission interval or increase the bit rate.

Furthermore, by thermally connecting the optical connector and the cooling unit added to the electronic circuit part, heat generated by optoelectric or electro-optical converters comprised in the optical connector can readily be radiated without adding any heat sink to the optical connector.

In addition, the optical connector having a plurality of optical signal connectors for connecting a set of optical signal lines and another set of optical signal lines is used, so that in case where, for example, three boards A, B and C are to be mutually connected, the boards B and C can be interconnected together by using a single optical connector associated with the board A, which optical connector substitutes for two optical connectors respectively dedicated to the boards B and C.

We claim:

1. An electrical circuit apparatus, comprising:
   an electrical circuit board;
   at least one set of circuit modules provided on said electrical circuit board and electrically interconnected with each other, each of said set of circuit modules including a plurality of electrical circuits;
   a connector of the first kind disposed on said electrical circuit board, positioned between said set of circuit modules and having a plurality of contact electrodes electrically connected to said set of circuit modules;
   a connector of the second kind positioned on said connector of the first kind and having a plurality of contact electrodes of said connector of the first kind, said connector of the second kind being detachably connected to said connector of the first kind; and
   a first group of fibers connected to said connector of the second kind;
   said connector of the second kind having a plurality of opto-electrical circuits each being connected to one of said fibers of said first fiber group and to at least one of said plurality of contact electrodes possessed by said connector of the second kind and each being comprised of an electro/optical converter or an opto/electrical converter.

2. An electrical circuit apparatus, according to claim 1, wherein said first fiber group includes at least one fiber sheet comprised of a plurality of fibers arranged in a sheet configuration.

3. An electrical circuit apparatus according to claim 2, wherein said connector of the second kind has means for supporting said fiber sheet such that its sheet surface extends in a direction substantially parallel to a direction along which said set of electrical circuit modules are arranged.

4. An electrical circuit apparatus according to claim 1, wherein said first fiber group includes a plurality of fiber sheets each comprised of a plurality of fibers arranged in a sheet configuration.

5. An electrical circuit apparatus according to claim 4, wherein said connector of the second kind has means for supporting said plurality of fiber sheets such that sheet surfaces of respective fibers sheets extend substantially in a same direction.

6. An electrical circuit apparatus according to claim 5, wherein said connector of the second kind has means for supporting said plurality of fiber sheets such that their sheet surfaces extend in a direction substantially parallel to a direction along which said set of electrical circuit modules are arranged.

7. An electrical circuit apparatus according to claim 4, wherein said connector of the second kind has means for supporting said plurality of fibers sheets such that they are arranged in a direction substantially in parallel to a direction in which said set of electrical circuit modules are arranged.

8. An electrical circuit apparatus according to claim 4, wherein said connector of the second kind has means for supporting said plurality of fiber sheets such that they are arrayed in a first direction substantially vertical to a second direction along which said set of electrical circuit modules are arranged and such that their sheet surfaces extend substantially in parallel to the second direction.

9. An electrical circuit apparatus according to claim 1, further comprising:
   another set of electrical circuit modules respectively positioned adjacently to corresponding modules of said set of electrical circuit modules;
   another connector of the first kind positioned between said another et of electrical circuit modules and having substantially the same construction as said connector of the first kind;
   another connector of the second kind positioned on said another connector of the first kind so as to be coupled thereto and having substantially the same construction as said connector of the second kind; and
   a second group of fibers connected to said another connector of the second kind.

10. An electrical circuit apparatus according to claim 9, further comprising:
    further another set of connectors of the first kind each positioned between a corresponding one of said set of electrical circuit modules and a corresponding one of said another set of electrical circuit modules and having substantially the same construction as said connector of the first kind;
    further another set of connectors of the second kind respectively positioned on corresponding ones of said second connectors of said further another set of connectors of the first kind and detachably coupled thereto, said further another set of connectors of the second kind having substantially the same construction as said connector of the second kind; and
    third and fourth groups of fibers respectively connected to corresponding connectors of the second kind of said further another set.

11. An electrical circuit apparatus according to claim 10, wherein each fiber group includes a plurality of fiber sheets each comprised of a plurality of fibers arranged in a sheet configuration.

12. An electrical circuit apparatus according to claim 11, wherein each connector of the second kind has means for supporting said plurality of fiber sheets connected thereto such that they are arranged in a first direction substantially vertical to a second direction along which a set of electrical circuit modules sandwiching said connectors of the second type are arranged and such that their sheet surfaces extend substantially in parallel to the second direction.

13. An electrical circuit apparatus, comprising:
    an electrical circuit board;
    a plurality of circuit modules provided on said electrical circuit board and electrically interconnected with each other, each of said plurality of circuit modules including a plurality of electrical circuits;

a plurality of connectors of a first kind positioned at sites between adjacent ones of said plurality of circuit modules and at sites surrounding said circuit modules and each having a plurality of contact electrodes electrically connected to at least one of said circuit modules;

a plurality of connectors of a second kind respectively positioned on said plurality of connectors of the first kind and each having a plurality of contact electrodes coupled to said plurality of contact connectors of one of said connectors of the first kind, said connector of the second kind being detachably connected to said one connector of the first kind; and a plurality of groups of fibers with each group of fibers connected to one of said plurality of connectors of the second kind, each of said plurality of connectors of the second kind including a plurality of opto-electrical circuits each being connected to one of fibers of one fiber group connected to said each connector of the second kind and to at least one of a plurality of contact electrodes possessed by said each connector of the second kind, said opto-electrical circuits each being comprised of an electro-optical converter or an opto/electrical converter.

14. An electrical circuit apparatus according to claim 13, wherein each fiber group includes a plurality of fiber sheets each comprised of a plurality of fibers arranged in a sheet configuration and having their sheet surfaces arranged in parallel and facing substantially in a same direction.

15. An electrical circuit apparatus, comprising:
an electrical circuit board;
at least one circuit module provided on said electrical circuit board and including a plurality of electrical circuits;
means provided above said circuit module, for cooling the same;
a connector of a first kind having a plurality of contact electrodes electrically connected to said circuit module;
a connector of a second kind positioned on said connector of the first kind and having a plurality of contact electrodes coupled to said plurality of contact electrodes of said connector of the first kind, said connector of the second kind being detachably connected to said connector of the first kind; and
a group of fibers connected to said connector of the second kind,
said connector of the second kind having a plurality of opto-electrical circuits each being connected to one of said fibers of said fiber group and to at least one of said plurality of contact electrodes possessed by said connector of the second kind and each being comprised of an electro/optical converter or an opto/electrical converter, said connector of the second kind being thermally coupled to said cooling means.

16. An electrical circuit apparatus according to claim 15, wherein said cooling means has an internal cavity through which a cooling medium is passed.

17. An electrical circuit apparatus according to claim 15, further comprising a thermal conductor located between said connector of the second kind and said cooling means.

18. An electrical circuit apparatus according to claim 15, further comprising:
at least one another circuit module provided on said electrical circuit board and including a plurality of electrical circuits; and
another cooling means provided on said another circuit module, for cooling the same,
said connector of the first kind being disposed between said circuit module and said another circuit module,
said connector of the second kind being thermally coupled to both of said cooling means and said another cooling means.

19. An electrical circuit apparatus according to claim 18, wherein said fiber group includes a fiber sheet comprised of a plurality of fibers arranged in a sheet configuration, and said connector of the second kind has means for supporting said fiber sheet such that its sheet surface extends in a direction substantially parallel to a direction along which said electrical circuit module and said other electrical circuit module are arranged.

20. An electrical circuit apparatus according to claim 18, wherein said fiber group includes a plurality of fiber sheets each comprised of a plurality of fibers arrange din a sheet configuration, and said connector of the second kind has means for supporting said plurality of fiber sheets such that they are arranged in a first direction substantially vertical to a second direction along which said electrical circuit module and said other electrical circuit module are arranged and their sheet surfaces extend substantially in parallel to the first direction.

21. An electrical circuit apparatus, comprising:
an electrical circuit board;
a plurality of circuit modules provided on said electrical circuit board and electrically interconnected with each other, each of said plurality of circuit modules including a plurality of electrical circuits;
a plurality of connectors of a first kind provided on a peripheral portion of a region in which said plurality of circuit modules are disposed and each having a plurality of contact electrodes electrically connected to at least one of said circuit modules;
a plurality of connectors of a second kind respectively positioned on said plurality of connectors of the first kind and each having a plurality of contact electrodes coupled to a plurality of contact electrodes on one of said connectors of the first kind, said connector of the second kind being detachably connected to said one connector of the first kind; and
a plurality of groups of fibers with each group being connected to a corresponding one of said plurality of connectors of the second kind,
each of said plurality of connectors of the second kind including a plurality of opto-electrical circuit each being connected to one of fibers of one fiber group connected to said each connector of the second kind and to at least one of a plurality of contact electrodes possessed by said connector, each opto-electrical circuit being comprised of an electro/optical converter or an opto/electrical converter.

22. An electric circuit apparatus according to claim 21, wherein each fiber group includes a plurality of fiber sheets each comprised of a plurality of fibers arranged in a sheet configuration and having their sheet surfaces which extend in a substantially same direction.

23. An electrical circuit apparatus, comprising:
an electrical circuit board;
a plurality of module substrates so provided on said electrical circuit board as to extend vertically of said electrical circuit board, said module substrates being arranged in parallel with each other;
a plurality of circuit modules each provided on one of said module substrates and each including a plurality of electrical circuits;
at least one connector of a first kind provided on said electrical circuit board between an adjacent two of said plurality of modules substrates and having a plurality of contact electrodes electrically connected to one of said circuit modules provided on one of said plurality of module substrates;
a connector of a second kind positioned on said connector of the first kind and having a plurality of contact electrodes coupled to said plurality of contact electrodes of said connector of the first kind, said connector of the second kind being detachably connected to said connector of the first kind; and
a group of fibers connected to said connector of the second kind,
said connector of the second kind having a plurality of opto-electrical circuits each being connected to one of said fibers of said fiber group and to at least one of said plurality of contact electrodes possessed by said connector and each being comprised of an electro/optical converter or an opto/electrical converter.

24. An electrical circuit apparatus according to claim 23, wherein said fiber group includes a plurality of fiber sheets each comprised of a plurality of fibers arranged in a sheet configuration and having their sheet surfaces which extend in a substantially same direction.

25. An electrical circuit apparatus, comprising:
an electrical circuit board;
at least one circuit module provided on a first surface of said electrical circuit board and each including a plurality of electrical circuits;
a connector of a first kind provided at a position on a second surface, of said electrical circuit, opposite to said first surface and opposing said circuit module, and having a plurality of contact electrodes electrically connected to said circuit module;
a connector of a second kind positioned on said connector of the first kind and having a plurality of contact electrodes coupled to sid plurality of contact electrodes of said connector of the first kind, said connector of the second king being detachably connected to said connector of the first kind; and
a group of fibers connected to said connector of the second kind,
said connector of the second kind having a plurality of opto-electrical circuits each being connected to one of fibers of said fiber group and to at least one of sid plurality of contact electrodes possessed by said connector, and each being comprised of an electro/optical converter or an opto/electrical converter.

26. An electrical circuit apparatus according to claim 25, wherein said fiber group includes a plurality of fiber sheets each comprised of a plurality of fibers arranged in a sheet configuration and having their sheet surfaces which extend in a substantially same direction.

27. An electrical circuit apparatus according to claim 25, further comprising:
another circuit module provided on said first surface of said electrical circuit board and each including a plurality of electrical circuit, said one circuit module and said another circuit module being interconnected with each other;
another connector of the first kind provided at a position on said second surface and opposing said another circuit module and having a plurality of contact electrodes electrically connected to said another circuit module;
another connector o the second kind positioned on said another connector of the first kind and having substantially the same construction as said connector of the second kind; and
another group of fibers connected to said another connector of the second kind.

28. An electrical circuit apparatus according to claim 27, wherein said another fiber group includes a plurality of fiber sheets each comprised of a plurality of fibers arranged in a sheet configuration and having their sheet surfaces which extend in a substantially same direction.

29. An electrical circuit apparatus, comprising:
an electrical circuit board;
at least one circuit module provided on said electrical circuit board and including a plurality of circuits;
a connector of a first kind provided on said electrical circuit board and having a plurality of contact electrodes electrically connected to said circuit module;
a connector of a second kind having a plurality of contact electrodes connected to said plurality of contact electrodes of said connector of the first kind and being detachably connected to said connector of the first kind; and
a group of fibers connected to said connector of the second kind,
said connector of the second kind having:
at least one opto-electrical circuit which is either a first opto-electrical element connected to a first fiber of said fiber group, for converting an optical signal supplied from said first fiber into a first electrical signal or a second opto-electrical element connected to a second fiber of said fiber group for converting a second electrical signal supplied from said electrical circuit board into an optical signal to be provided to said second fiber; and
at least one register which is a first register responsive to a clock signal supplied from said circuit module receiving the first electrical signal supplied from said first opto-electrical element and applying the received first electrical signal to said circuit module or a second register responsive to said clock signal, receiving the second electrical signal supplied from said circuit module and applying the second electrical signal to said second opto-electrical element.

30. An electrical circuit apparatus according to claim 29, wherein said connector of the second kind has said first opto-electrical element, said second opto-electrical element, said first register and said second register.

31. A connector comprising:
fiber supporting means for supporting ends of a plurality of fiber sheets each comprised of a plurality of fibers bundled in a sheet form such that respective sheet surfaces are held in parallel and said fiber sheets are arrayed in a direction substantially vertical to the sheet surfaces;

a plurality of contact electrodes disposed in an opposite direction to a direction in which said plurality of fiber sheets extend; and a plurality of optoelectrical circuits provided in association with individual fibers of said fiber sheet and including any one of an opto/electrical converter circuit converting an optical signal supplied from a corresponding fiber into an electrical signal and applying the electrical signal to one of said plurality of contact electrodes and an electro/optical converter circuit converting an electrical signal supplied from one of said plurality of contact electrodes into an optical signal and applying the optical signal to corresponding a fiber.

32. A connector according to claim 31, wherein the length of said connector in the direction of array of said plurality of fiber sheets is larger than the width of said plurality of fiber sheets.

33. A connector according to claim 31, wherein at least one of said plurality of opto-electrical circuits which includes an electro/optical converter circuit has a register receiving an electrical signal supplied from one of said plurality of contact electrodes in synchronism with a clock signal supplied from a different one of said plurality of contact electrodes; and an electro/optical converter element converting an output signal into an optical signal.

34. A connector according to claim 31, wherein at least one of said plurality of opto-electrical circuits which includes an opto-electrical converter circuit has an opto/electrical converter element converting an optical signal supplied from one of said plurality of fibers into an electrical signal; and a register fetching an output signal of said opto/electrical converter element in synchronism with a clock signal supplied from a third one of said plurality of contact electrodes and applying the fetched signal to one of said plurality of contact electrodes.

35. A connector according to claim 31, wherein each of said plurality of opto-electrical circuits which includes an electro/optical converter circuit has:
a first register fetching an electrical signal supplied from a first one of said plurality of contact electrodes in synchronism with a clock signal supplied from a second one of said plurality of contact electrodes; and an electro/optical converter element converting an output signal of said first register into an optical signal, and wherein each of said plurality of opto-electrical circuits which includes an opto/electrical converter circuit has:
an opto/electrical converter element converting an optical signal supplied from one of said plurality of fibers; and
a second register for receiving an output signal from said opto/electrical converter element in synchronism with a clock signal supplied from a third one of said plurality of contact electrodes and applying the fetched signal to a fourth one of said plurality of contact electrodes.

36. A connector for connecting fibers to an electrical circuit board, comprising:
at least one of a first opto/electrical converter element connected to said fibers converting an optical signal supplied therefrom into a first electrical signal and a second electro/optical converter element converting a second electrical signal supplied from said electrical circuit board into an optical signal; and at least one of a first register receiving the first electrical signal supplied from said first opto/electrical connecter element in response to a clock signal supplied from said electrical circuit board and applying the received first electrical signal to said electrical circuit board and a second register receiving the second electrical signal supplied from said electrical circuit board in response to the clock signal and applying the received second electrical signal to said second electro/optical converter element.

37. An electrical circuit apparatus, comprising:
an electrical circuit board;
at least one first set of circuit modules provided on said electrical circuit board and electrically interconnected with each other, each said first set of circuit modules including a plurality of electrical circuits;
a first group of fibers; and
a first connecting electric part disposed on said electrical circuit board, positioned between said first set of circuit modules for electrically connected said first group of fibers to said first set of circuit modules, said first connecting electric connecting part having (a) a plurality of contact electrodes electrically connected to said first set of circuit modules; and (b) a plurality of opto-electrical circuits each being connected to one of said fibers of said first fiber group and to at least one of said plurality of contact electrodes, and each being comprised of an electro/optical converter on an opto/electrical converter.

38. An electrical circuit apparatus, according to claim 37, wherein said first fiber group includes at least one fiber sheet comprised of a plurality of fibers arranged in a sheet configuration.

39. An electrical circuit apparatus according to claim 38, wherein said first connecting electric part has means for supporting said fiber sheet such that its sheet surface extends in a direction substantially parallel to a direction along which said first set of electrical circuit modules are arranged.

40. An electrical circuit apparatus according to claim 37, wherein said first fiber group includes a plurality of fiber sheets each comprised of a plurality of fibers arranged in a sheet configuration.

41. An electrical circuit apparatus according to claim 40, wherein said first connecting electric part has means for supporting sid plurality of fiber sheets such that sheet surfaces of respective fiber sheets extend substantially in a same direction.

42. An electrical circuit apparatus according to claim 41, wherein said first connecting electric part has means for supporting said plurality of fiber sheets such that their sheet surfaces extend in a direction substantially parallel to a direction along which said first set of electrical circuit modules are arranged.

43. An electrical circuit apparatus according to claim 40, wherein said first connecting electric part has means for supporting said plurality of fiber sheets such that they are arranged in a direction substantially in parallel to a direction in which said first set of electrical circuit modules are arranged.

44. An electrical circuit apparatus according to claim 40, wherein said first connecting electric part has means for supporting said plurality of fiber sheets such that they are arranged in a first direction substantially vertical to a second direction along which said first set of electrical circuit modules are arranged, and wherein their sheet surfaces extend in parallel to the second direction.

45. An electrical circuit apparatus according to claim 37, further comprising:
- at least one second set of electrical circuit modules respectively positioned adjacent to corresponding modules of said first set of electrical circuit modules;
- a second group of fibers; and
- a second connecting electric part positioned on said electrical circuit board and between said second set of electrical circuit modules for electrically connecting said second group of fibers to said second set of electrical circuit modules, said second connecting electric part having substantially the same construction as said first connecting electric part.

46. An electrical circuit apparatus according to claim 45, further comprising:
- third an fourth groups of fibers,
- a set of third connecting electric parts each positioned between a corresponding one of said first set of electrical circuit modules and a corresponding one of said second set of electrical circuit modules, each of said third connecting electric part being arranged for electrically connecting one group of said third and fourth groups of fibers to at least one of a corresponding one of said first set of electrical circuit modules and a corresponding one of said second set of electrical circuit modules, and each of the set of third connecting electric parts having substantially the same construction as said first connecting electric part.

47. An electrical circuit apparatus according to claim 46, wherein each fiber group includes a plurality of fiber sheets each comprised of a plurality of fibers arranged in a sheet configuration.

48. An electrical circuit apparatus according to claim 47, wherein each of said first, second and third connecting electric parts has means for supporting said plurality of fiber sheets connected thereto such that they are arrayed in a first direction substantially vertical to a second direction along which at least one of said first and second sets of electrical circuit modules are arranged, and wherein said surfaces of said fiber sheets extend substantially in parallel to the second direction.

49. An electrical circuit apparatus, comprising:
- an electrical circuit board;
- a plurality of first circuit modules provided on said electrical circuit board and electrically interconnected with each other, each of said plurality of first circuit modules including a plurality of electrical circuits;
- a plurality of groups of fibers;
- a plurality of first connecting electric parts positioned at sites between adjacent ones of said plurality of first circuit modules and at sites surrounding said first circuit modules, each for electrically connecting a corresponding one group within said groups of at least one of said plurality of circuit modules, each first connecting electric part having a plurality of contact electrodes electrically connected to at least one of said first circuit modules; and
- a plurality of opt-electrical circuit each connected to one of fibers of one fiber group corresponding to said each first connecting electric part and to at least one of said plurality of contact electrodes, said opto-electrical circuits each being comprised of an electro/optical converter or an opto-electrical converter.

50. An electrical circuit apparatus according to claim 49, wherein each fiber group includes a plurality of fiber sheets each comprised of a plurality of fibers arranged in a sheet configuration and having their sheet surfaces arranged in parallel and facing substantially in a same direction.

51. An electrical circuit apparatus, comprising:
- an electrical circuit board;
- at least a first circuit module provided on said electrical circuit board and including a plurality of electrical circuits;
- first cooling means provided adjacent said first circuit module, for cooling the same;
- a group of fibers;
- a connecting electric part for electrically connecting said group of fibers to said first circuit module, having (a) a plurality of contact electrodes electrically connected to said first circuit module; and (b) a plurality of opto-electrical circuit each being connected to one of said fibers of said fiber group and to at least one of said plurality of contact electrodes, and each being comprised of an electro/optical converter or an opto/electrical converter, said connecting electric part being thermally coupled to said first cooling means.

52. An electrical circuit apparatus according to claim 51, further comprising a thermal conductor interposed between said connecting electric part and said cooling means.

53. An electrical circuit apparatus according to claim 51, further comprising:
- at least a second circuit module provided on said electrical circuit board and including a plurality of electrical circuits; and
- a second cooling means provided adjacent said second circuit module, for cooling the same,
- said connecting electric part being disposed between said first circuit module and said second circuit module,
- said connecting electric part being thermally coupled to both of said first cooling means and said second cooling means.

54. An electrical circuit apparatus according to claim 53, wherein said fiber group includes a fiber sheet comprised of a plurality of fibers arrayed in a sheet configuration, and said connecting electric part has means for supporting said fiber sheet such that its sheet surface extends in a direction substantially parallel to a direction along which said first electrical circuit module and said second electrical circuit module are arranged.

55. An electrical circuit apparatus according to claim 53, wherein said fiber group includes a plurality of fiber sheets each comprised of a plurality of fibers arranged in a sheet configuration, and said connecting body has means for supporting said plurality of fiber sheets such that they are arranged in a direction substantially vertical to a second direction along which said first electrical circuit module and said second electrical circuit module are arranged and their sheet surfaces extend substantially in parallel to the first direction.

56. An electrical circuit apparatus, comprising:

an electrical circuit board;

a plurality of circuit modules provided on said electrical circuit board and electrically interconnected with each other, each of said plurality of circuit modules including a plurality of electrical circuits;

a plurality of groups of fibers;

a plurality of connecting electric parts provided on a peripheral portion of a region in which said plurality of circuit modules are disposed each for electrically connecting a corresponding one group of fibers within said groups of fibers, each connecting electric part having (a) a plurality of contact electrodes electrically connected to at least one of said circuit modules; and (b) a plurality of opto-electrical circuits each being connected to one of fibers of one fiber group corresponding to sad each connecting electric part and to at least one of said plurality of contact electrodes of said each connecting electric part, wherein each opto/electrical circuit is comprised of an electro/optical converter or an opto/electrical converter.

57. An electrical circuit apparatus according to claim 56, wherein each fiber group includes a plurality of fiber sheets each comprised of plurality of fibers arranged in a sheet configuration and having their sheet surfaces which extend in a substantially same direction.

58. An electrical circuit apparatus, comprising:
an electrical circuit board;
a plurality of module substrates so provided on said electrical circuit board as to extend vertically of said electrical circuit board, said module substrates being arranged in parallel with each other and electrically interconnected with each other;
a plurality of circuit modules each provided on one of said module substrates and each including a plurality of electrical circuits;
a group of fibers;
at least one connecting electric part provided on said electrical circuit board between an adjacent two of said plurality of modules substrates for electrically connecting said group of fibers to at least one of said circuit modules, said connecting electric part having (a) a plurality of contact electrodes electrically connected to one of said circuit modules provided on one of said plurality of module substrates; and (b) a plurality of opto-electrical circuits each being connected to one of said fibers of said fiber group and to at least one of said plurality of contact electrodes, and each being comprised of an electro/optical converter or an opto-electrical converter.

59. An electrical circuit apparatus according to claim 58, wherein said fiber group includes a plurality of fiber sheets each comprised of a plurality of fibers arranged in a sheet configuration and having their sheet surfaces which extend in a substantially same direction.

60. An electrical circuit apparatus, comprising:
an electrical circuit board;
at least one first circuit module provided on a first surface of said electrical circuit board and each including a plurality of electrical circuits;
a first group of fibers; and
a first connecting electric part provided at a position on a second surface, of said electrical circuit, opposite to said first surface and opposing said first circuit module for electrically connecting said first group of fibers to said first circuit module, said first connecting electric part having (a) a plurality of contact electrodes electrically connected to said first circuit module and (b) a plurality of opto-electrical circuits each being connected to one of said fibers of said first fiber group and to at least one of said plurality of contact electrodes, and each being comprised of an electro/optical converter or an opto/electrical converter.

61. An electrical circuit apparatus according to claim 60, wherein said first fiber group includes a plurality of fiber sheets each comprised of a plurality of fibers arranged in a sheet configuration and having their sheet surface which extend in a substantially same direction.

62. An electrical circuit apparatus according to claim 60, further comprising:
at least one second module provided on said first surface of said electrical circuit board and each including a plurality of electrical circuits, said first circuit module and said second circuit module being interconnected with each other;
a second group of fibers;
a second connecting electric part provided at a position on said second surface and opposing said second circuit module for electrically connecting said second group of fibers to said second circuit module, said second connecting electric part having substantially the same construction as said first connecting electric part.

63. An electrical circuit apparatus according to claim 62, wherein said second fiber group includes a plurality of fiber sheets each comprised of a plurality of fibers arranged in a sheet configuration and having their sheet surfaces which extend in a substantially same direction.

64. An electrical circuit apparatus, comprising:
an electrical circuit board;
at least one circuit module provided on said electrical circuit board and including a plurality of circuits;
a group of fibers;
a connecting electric part provided on said electrical circuit board for electrically connecting said group of fibers to said circuit module, having (a) a plurality of contact electrodes electrically connected to said circuit module and (b) at least one opto-electrical circuit which is either a first opto-electrical element connected to a first fiber of said fiber group, for converting an optical signal supplied from said first fiber into a first electrical signal, or a second opto-optical element connected to a second fiber of said fiber group for converting a second electrical signal supplied from said electrical circuit board into an optical signal to be provided to said second fiber; and (c) at least one register which is either a first register responsive to a clock signal supplied from said circuit module receiving the first electrical signal supplied from said first opto-electrical element and applying the received first electrical signal to said circuit module, or a second register responsive to said clock signal, receiving the second electrical signal supplied from said circuit module and applying the second electrical signal to said second opto-electrical element.

65. An electrical circuit apparatus according to claim 64, wherein said connecting electric part has said first opto-electical element, said second opto-electrical element, said first register and said second register.

66. An electrical circuit apparatus according to claim 51, wherein the first cooling means is located above the first circuit module.

67. An electrical circuit apparatus according to claim 53, wherein the second cooling means is provided on said second circuit module.

* * * * *